(12) United States Patent
Mohan et al.

(10) Patent No.: US 6,775,324 B1
(45) Date of Patent: Aug. 10, 2004

(54) DIGITAL SIGNAL MODULATION SYSTEM

(75) Inventors: Chandra Mohan, Carmel, IN (US); Wilhelm Ernst Riedl, Indianapolis, IN (US); Zhiming Zhang, Indianapolis, IN (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 0 days.

(21) Appl. No.: 09/623,776

(22) PCT Filed: Mar. 11, 1999

(86) PCT No.: PCT/US99/05301

§ 371 (c)(1),
(2), (4) Date: Dec. 6, 2000

(87) PCT Pub. No.: WO99/46861

PCT Pub. Date: Sep. 16, 1999

Related U.S. Application Data

(60) Provisional application No. 60/077,537, filed on Mar. 11, 1998.

(51) Int. Cl.[7] .............................. H03K 7/08; H03K 9/08
(52) U.S. Cl. ........................ 375/238; 329/312; 332/109
(58) Field of Search ................................. 375/238, 141, 375/146, 147, 359; 332/109; 329/312

(56) References Cited

U.S. PATENT DOCUMENTS

| | | | |
|---|---|---|---|
| 4,462,051 A | | 7/1984 | Chan ............................ 360/44 |
| 4,742,532 A | | 5/1988 | Walker ......................... 375/50 |
| 5,150,377 A | * | 9/1992 | Vannucci ..................... 375/146 |
| 5,185,765 A | | 2/1993 | Walker ......................... 375/22 |
| 5,500,871 A | * | 3/1996 | Kato et al. ................... 375/146 |
| 5,524,121 A | * | 6/1996 | Nambu ........................ 375/238 |

FOREIGN PATENT DOCUMENTS

| | | | | |
|---|---|---|---|---|
| JP | 62-279562 | | 12/1987 | ........... G11B/20/20 |
| WO | 90/11649 | | 10/1990 | ............ H03M/5/12 |
| WO | 90/11650 | | 10/1990 | ............ H03M/5/12 |

OTHER PUBLICATIONS

Patent Abstracts of Japan, vol. 012, No. 166, May 19, 1988 & JP 62–279562 (See Ref. AF).

H. R. Walker, VPSK and VMSK Modulation Transmit Digital Audio and Video at 15 BITS/SEC/HZ, IEEE Transactions on Broadcasting, Mar. 1997, vol. 43, No. 1, pp. 96–103.

H. R. Walker, The Advantages of VPSK Modulation For Data Transmission, pp. 454–462.

H. R. Walker, Attain High Bandwidth Efficiency With VMSK Modulation Microwaves & RF, Dec. 1997, pp. 173–185.

B. Stryzak et al., Improve Data Transmisstions Using SIngle–Sideban FM with Suppressed Carrier, Microwaves &RF, Nov. 1994 , pp. 23–29.

E.B. Carne, Digital Modulation, Telecommunications Primer–Signals, Building BLocks and Networks, Chapter 4.

* cited by examiner

Primary Examiner—Young T. Tse
Assistant Examiner—David B. Lugo
(74) Attorney, Agent, or Firm—Joseph S. Tripoli; Joseph J. Laks; Ronald H. Kurdyla

(57) ABSTRACT

A variable aperture coding/decoding system suitable for use in a spread spectrum system provides multiple phase coding of an input NRZ bitstream. Each bit of a coded output signal is coded to encompass a predetermined different number of clock periods depending on the logic level of the input signal. A coded bit exhibits a predetermined reference number of clock periods, eg., 9, when the input signal does not exhibit a logic level transition. When the input signal exhibits a phase change from a 0 to a 1 logic level, the bit width of an associated coded bit is increased by 1 clock period, to 10 clock periods. When the input signal exhibits a phase change from a 1 to a 0 logic level, the bit width of an associated coded bit is decreased by 1 clock period, to 8 clocks periods. Thus the coded output signal may contain three types of information represented by a bit width change proportional to predetermined factor N.

15 Claims, 6 Drawing Sheets

ENCODER LOGIC $1 \rightarrow 0$ : $\left.\begin{array}{ll} 4,2,1 & :H \\ 8 & :L \end{array}\right\}$ DIVIDE BY 8

$0 \rightarrow 1$ : $\left.\begin{array}{ll} 8,1 & :H \\ 4,2 & :L \end{array}\right\}$ DIVIDE BY 10

$\left.\begin{array}{l} 0 \rightarrow 0 \\ 1 \rightarrow 1 \end{array}\right.$ : $\left.\begin{array}{ll} 8 & :H \\ 4,2,1 & :L \end{array}\right\}$ DIVIDE BY 9

(NO CHANGE)

| STATE ÷ | 8 | 4 | 2 | 1 |
|---|---|---|---|---|
| (A) 1 → 0 | - | X | X | X |
| (B) 0 → 1 | X | - | - | X |
| (C) 0 → 0 | X | - | - | - |
| (C) 1 → 1 | X | - | - | - |

FIG. 3

DIGITAL SIGNAL MODULATION SYSTEM

RELATED APPLICATION

This application is based upon, claims the priority of and incorporates by reference the entire contents of U.S. Provisional Application Serial No. 60/077,537, filed Mar. 11, 1998, which is assigned to the same assignee as the present application.

FIELD OF THE INVENTION

The present invention concerns digital signal phase modulation that is particularly suitable for spread spectrum applications.

BACKGROUND OF THE INVENTION

Two well-known modulation techniques for radio frequency (RF) bandwidth compression (ie., promoting spectral efficiency) are quadrature amplitude modulation (QAM) and quadradrature phase shift keying (QPSK). Both of these methods suffer a loss of signal power with increasing modulation levels or the accompanying bandwidth compression. In addition, these methods are likely to result in errors because of low signal to noise ratio (SNR). To compensate for these errors, an increase in power approximately equal to to the square of the increase in bandwidth compression is required. For example, ten times bandwidth compression requires a 100 times increase in power.

Some commonly used modulation techniques such as frequency shift keying (FSK), minimum frequency shift keying (MFSK), GMSK, and QAM transmit non-return to zero (NRZ) line coded data that concentrates bandwidth around a carrier. Bi-Phase coding (eg., Manchester and Miller coding, as known) keeps the information sidebands away from the carrier. FIG. 1 illustrates the spectral characteristics of digital bi-phase signals such as QPSK, BPSK, QAM, etc. The spectrum of line coded signals concentrates around baseband, whereas for digital bi-phase signals the spectrum moves away from the origin to a point around half of the transmitted bit rate. In order to obtain significant savings in the transmitted bandwidth, only one sideband need be transmitted. A bi-phase signal is time varying and hence has no zero crossing points that vary with time. Bi-phase codes are polar and have little or no DC component.

Another modulation method, pulse width modulation, is employed at baseband for spectrum encoding and produces output pulses which are integer multiples of the clock period. With this method, phase delays to the end or center of a data bit distinguish between "1" or "0" logic levels, respectively. Miller encoding is one example of this type of modulation. Modulating an RF carrier with this type of modulation does not conserve bandwidth.

U.S. Pat. No. 4,742,532 issued to H. R. Walker describes a method of modulation referred to as variable phase shift keying (VPSK). VPSK modulation encodes changes between "1" and "0" logic states of a binary non-return to zero data signal. The encoding produces a pulse signal having varying periods of 4/4, 5/4, and 6/4 multiples of the bit period according to a predetermined set of coding rules. According to the coding rules, no change in the data polarity is coded as a 4/4 bit width, a change in data polarity is coded as a 5/4 bit width, and a conditional case coding for the last bit is coded as a 6/4 bit width period to indicate a required reset of the coding/decoding system. This method can theoretically produce a Nyquist factor of 7.2 bits per Hz-bandwidth.

U.S. Pat. No. 5,185,765 of H. R. Walker describes an improved method of VPSK modulation. With this method, each input data bit has a bit period constituted by M clock periods. Data bit polarity changes are phase shift key coded with waveform widths of M/M, M+1/M, and M+2/M bit periods, where M is an even integer greater than 3. According to the coding rules, no change in the polarity of the data is coded as M clock periods, a change in the polarity of the data is coded as M+1/M clock periods, and a final encoding bit for the period to indicate a reset occuring at the M−1 data bit polarity change is coded as M+2/M clock periods. This method theoretically allows a signal spectrum to fit into one-sixth the bandwidth of a baseband NRZ equivalent signal, resulting in Nyquist efficiencies of up to 15.3 bits per Hz-bandwidth for 10 modulation levels. This variable phase shift causes the coding/decoding system to lose synchronization with the beginning of each bit period. To overcome this problem, a reset bit must be embedded in the data for every bit period.

A disclosed method of coding/decoding exhibits operating advantages compared to the systems described by Walker. In particular, the disclosed variable aperture coding method provides twice the efficiency of the method described in U.S. Pat. No. 5,185,765 of Walker, and is more economical with respect to hardware and software requirements.

SUMMARY OF THE INVENTION

A variable aperture coding system according to the principles of the present invention employs the following algorithm to encode an input NRZ bitstream.

If the bitstream exhibits a phase change from a logic 0 to a logic 1, an associated coded data bit exhibits a bit width change in one direction (eg., increases) proportional to a predetermined factor N.

If the bitstream logic level remains unchanged, the bit width of an associated coded bit is maintained at a predetermined original bit width.

If the bitstream exhibits a phase change from a logic 1 to a logic 0, an associated coded bit exhibits a bit width change in a different second direction (eg., decreases) proportional to predetermined factor N.

BRIEF DESCRIPTION OF THE DRAWINGS

FIG. 3 shows encoder logic tables used in the encoder of FIG. 2.

DETAILED DESCRIPTION OF THE DRAWINGS

Figure 1:
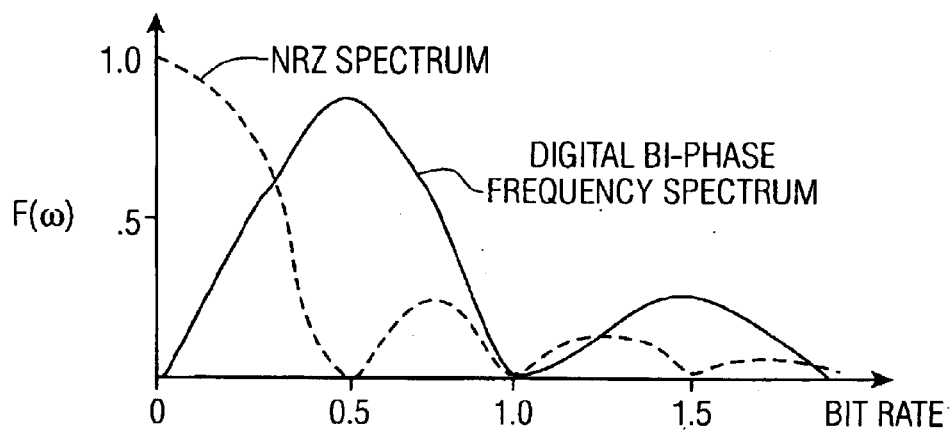
FIG. 1 shows a frequency spectrum for NRZ and bi-phase signals.

The disclosed signal coding method is referred to a Variable Aperture Coding, or VAC. The disclosed method overcomes the previously mentioned problem of QAM and QPSK systems of suffering a loss of signal power with increasing modulation levels or the accompanying bandwidth compression. The disclosed VAC method employs single sideband methods to compress the information bandwidth by a factor of 9:1, and can be implemented by direct frequency modulation on a carrier. The disclosed VAC bandwidth compression method is very useful in implementing a direct sequence spread spectrum system with the spread code performing a BPSK type of modulation on the carrier while the data is sent VAC coded on the carrier.

The disclosed arrangement exhibits a significant improvement in process gain. By definition, for any direct sequence spread spectrum system, the process gain is defined by 10 log [spread spectrum bandwidth/information bandwidth]. Higher process gain means it will take more power from interfering signals to disrupt the communication system. In a typical digital implementation, the following system parameters may apply:

spread bandwidth: 2 Mhz burst data rate: 80 Kbps (40 Kbps sent over a time division duplex link will have to be burst out at double the original rate.)

burst data bandwidth: 80 Khz at BT=1 (assuming minimal filtering)

The process gain under these conditions can be shown to be 13.97 db.

In the disclosed system the following parameters apply:

spread bandwidth: 2 Mhz information bandwidth: 4.44 Khz (40 Kbps at 9:1 compression). In this case the process gain can be shown to be 26.57 db. Thus the interfering signal needs to be 20 times more powerful to jam the disclosed system compared to a conventional digital system, a difference of 12.6 db. This allows transmission of larger amounts of data with immunity from interference with transmissions from other sources at the same frequency. This advantage is achieved by the arrangements shown in FIGS. 7 and 8. The higher process gain is achieved by the conversion of the digital information bits to the analog domain. This is not possible without either the encoders nor the biphase modulator block 710. On the receiver side, after block 832, a phase shift detector and a zero crossing detector complete the detection process. Detected data is then decoded by unit 836.

The disclosed VAC coding facilitates improved interference rejection and can be used in a variety of applications at significantly reduced cost and complexity. These applications include power line voice and data communications, in-band digital audio broadcast, cable modems, multiple line business telephones, and digital broadcast satellite systems using BPSK coding, for example. The disclosed modulation system will advantageously support in-house wired (eg., dedicated cable, dedicated 4-wire powerline) or wireless applications at carrier frequencies above 50 Khz.

As will be explained below, a system according to the present invention employs the following algorithm to encode an input NRZ bitstream as a function of a predetermined factor N. When N is 9 for example, if the bitstream exhibits a phase change from a 0 to a 1 logic level, the bit width of the associated bit in the coded bitstream is increased by 1 clock period, to 10 clock periods in this example. If the input NRZ datastream logic level remains unchanged, the bit width of an associated bit in the coded bitstream remains unchanged from a predetermined width, 9 clock cycles in this example. If the bitstream exhibits a phase change from a 1 to a 0 logic level, the bit width of the associated bit in the coded bitstream is decreased by 1 clock period, to 8 clock periods in this example. The described increase and decrease of bit width by 1 out of 9 clock cycles is one example. Other bit width variations are possible. With current technology, bit width variations of up to $\frac{1}{15}$ of the NRZ period can be produced without serious signal degradation. In such case RF bandwidth compression of about 30:1 is achievable. In addition, bit widths may be oppositely adjusted, ie., decreased or increased for logic level changes from 0 to 1 and from 1 to 0, respectively.

The disclosed system advantageously does not exhibit cumulative phase build up since phase excursions due to a high to low transition and due to a low to high transition are the same. Also in the disclosed system, data encoding is performed by a separate 9X clock and is not used to generate the Fc. The receiver detects the zero crossing and times the 9X decoding clock. This improves the adaptability of the system as the RF is totally independent from the encoding/decoding clocks. Furthermore, when the data does not change (repeated 1 or 0 logic levels), the 9X clock will be used to switch the bi-phase modulator in block 710 of FIG. 7. The simplifies the decoding circuits.

The principles of the invention involve not only the bit coding, but also the process of performing the bi-phase shift keying.

Figure 2:
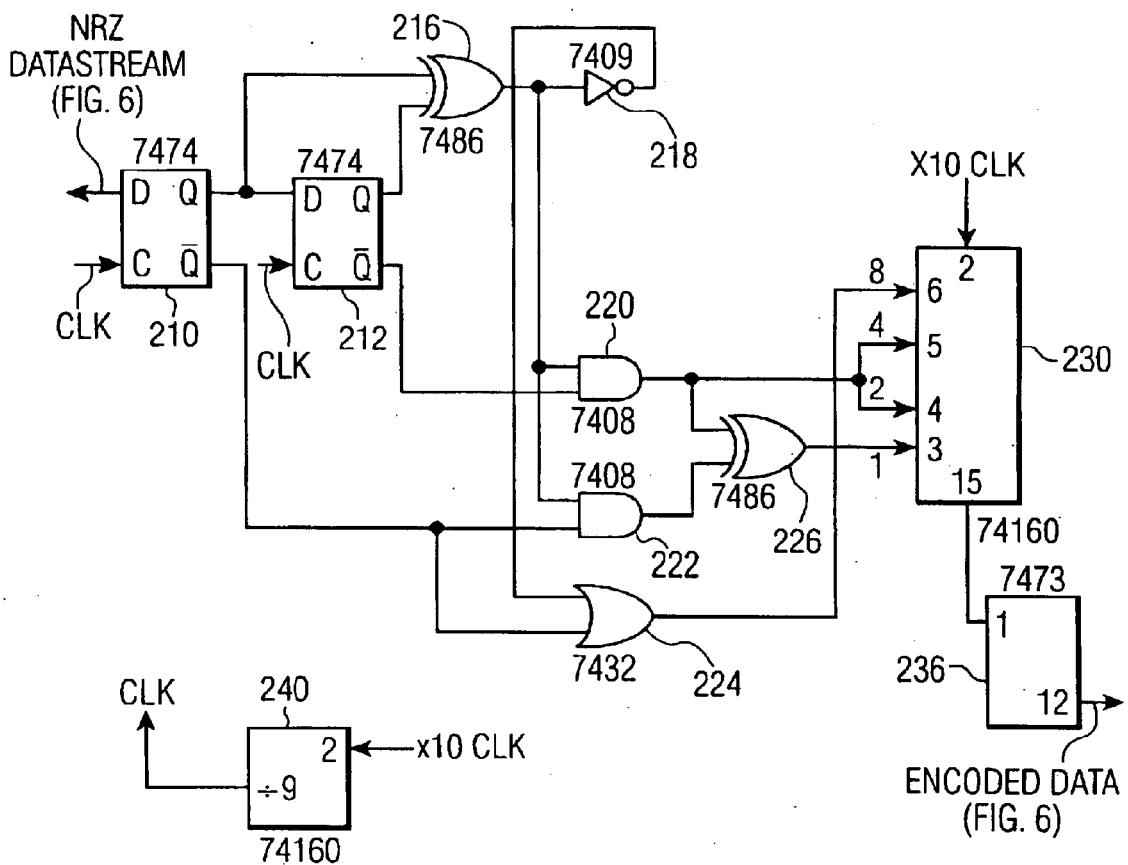
FIG. 2 shows an encoder network in accordance with the principles of the present invention.
Figure 4:
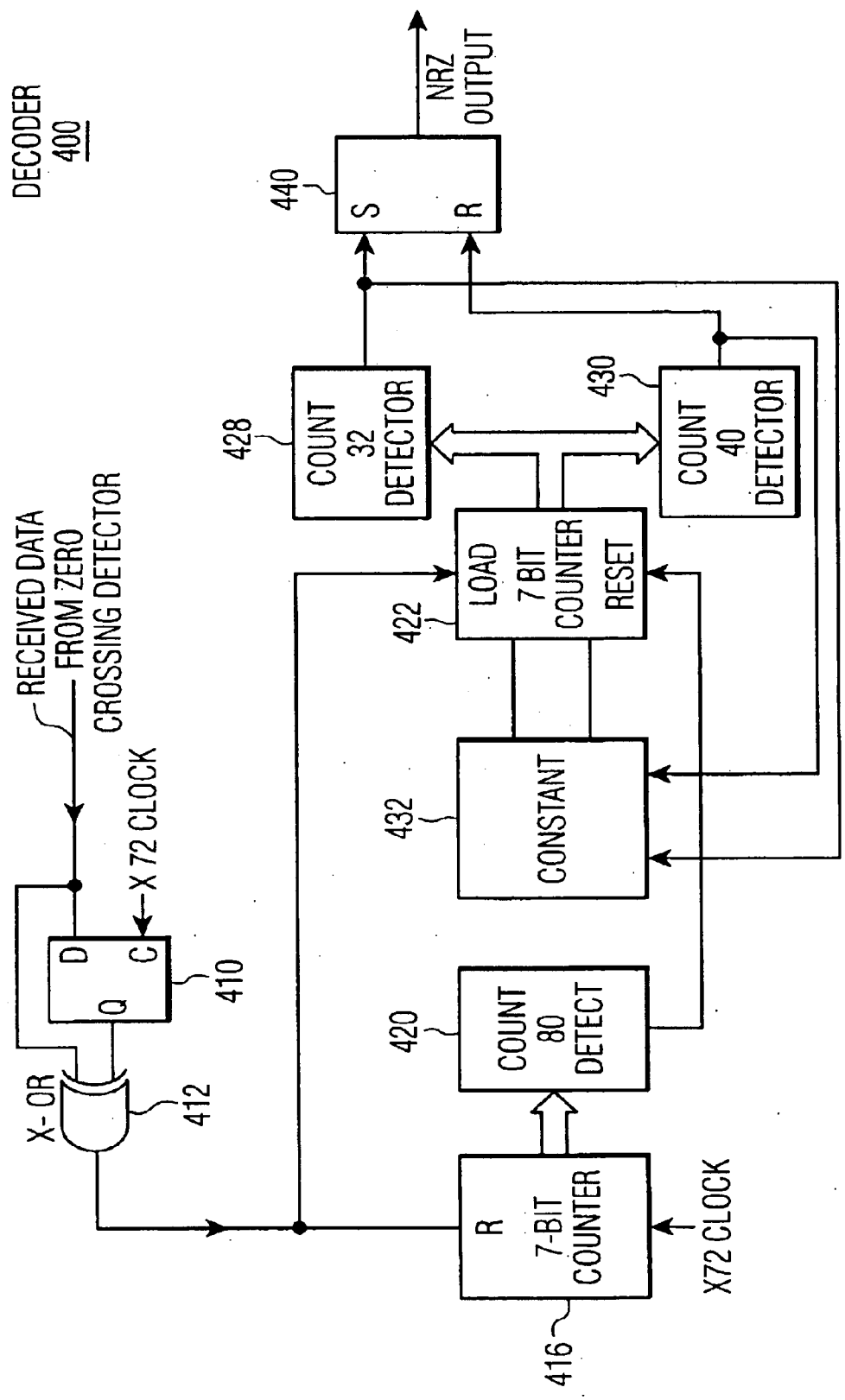
FIG. 4 shows a decoder network in accordance with the principles of the invention.

When alternate encoded bits are switched from zero degrees to 180 degrees in the biphase modulator, it reduces the noise floor due to cancellation of antipodal noise vectors. FIGS. 2 and 4 can be realized using a digital signal processor (DSP), discrete dedicated logic or FPGA.

Figure 7:
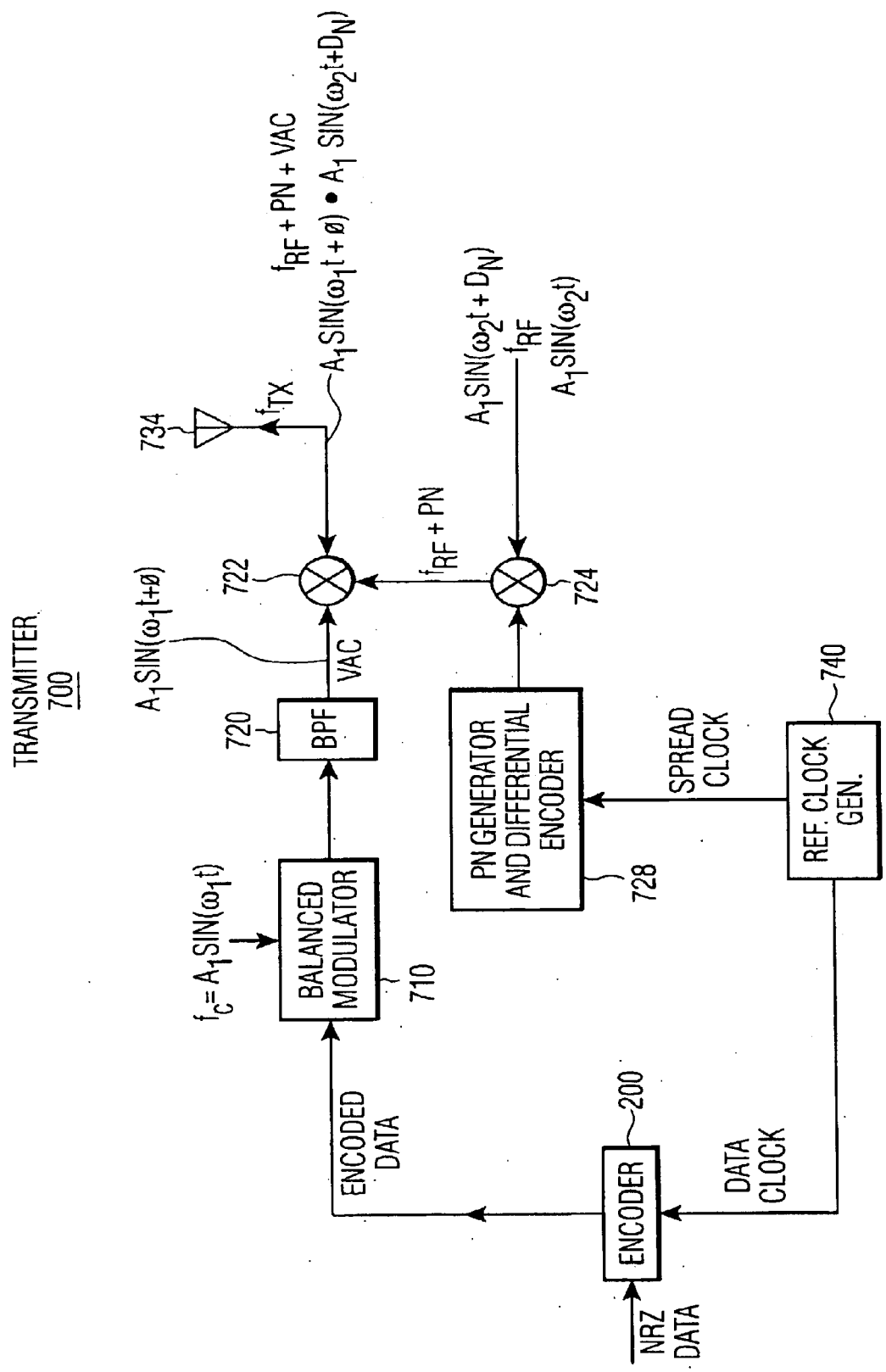
FIG. 7 shows a transmitter system including an encoder according to the present invention.
Figure 8:
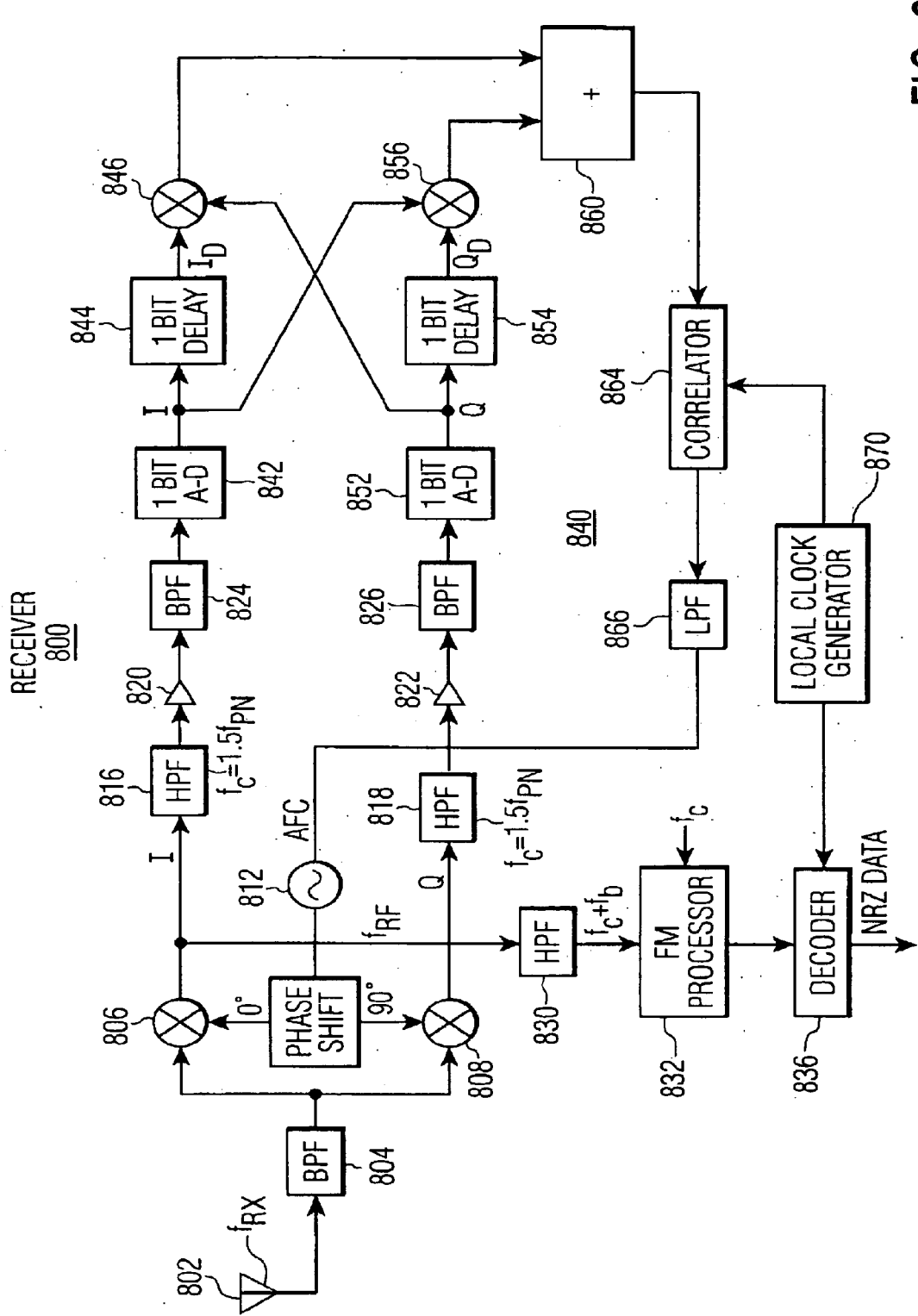
FIG. 8 shows a receiver including a decoder according to the present invention.

However, FIGS. 7 and 8 are unique in the sense that a direct sequence spread spectrum system with higher process gain is realized by virtue of embedding the digital information into an analog domain.

Figure 5:
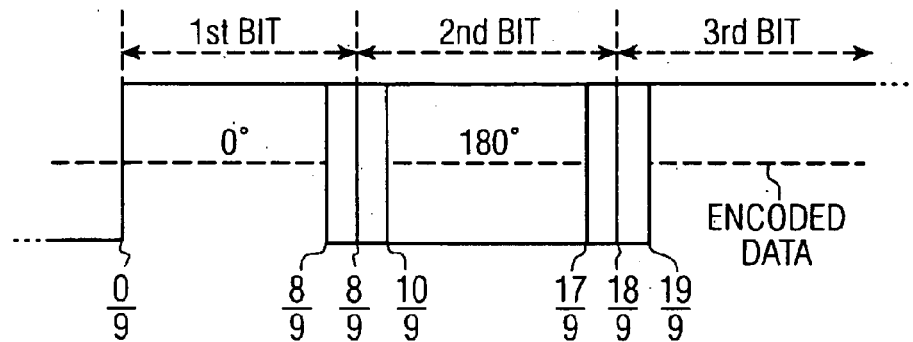
FIGS. 5 and 6 depict waveforms illustrating the principles of the present invention.

FIG. 5 illustrates variable aperture coding. In this example predetermined factor N equals 9 because in this example there are an average of 9 clock periods for each coded bit. Because in this embodiment the VAC coding rules increase or decrease the bit period by 1/N for a phase transition in the opposite direction, a bit period average will encompass 9 clock periods over time. No reset is required within the coded bit data because there is no additive phase shift (unlike VMSK modulation), and each rising or falling edge of the coded signal represents one bit of data. VPSK, in contrast, is limited to one bit of data for each N−1 bits of input data, after which a reset must resynchronize the coded data stream to the clock.

As seen in FIG. 5, one bit is equal, on average, to N clock periods where N=9 in this example. When the phase of the NRZ data transitions from logic 0 to logic 1, one encoded bit period encompasses one additional clock period, or 10 clock periods (10/9). When the phase of the NRZ data transitions from logic 1 to logic 0, one encoded bit period encompasses one less clock period, or 8 clock periods (8/9).

Figure 6:
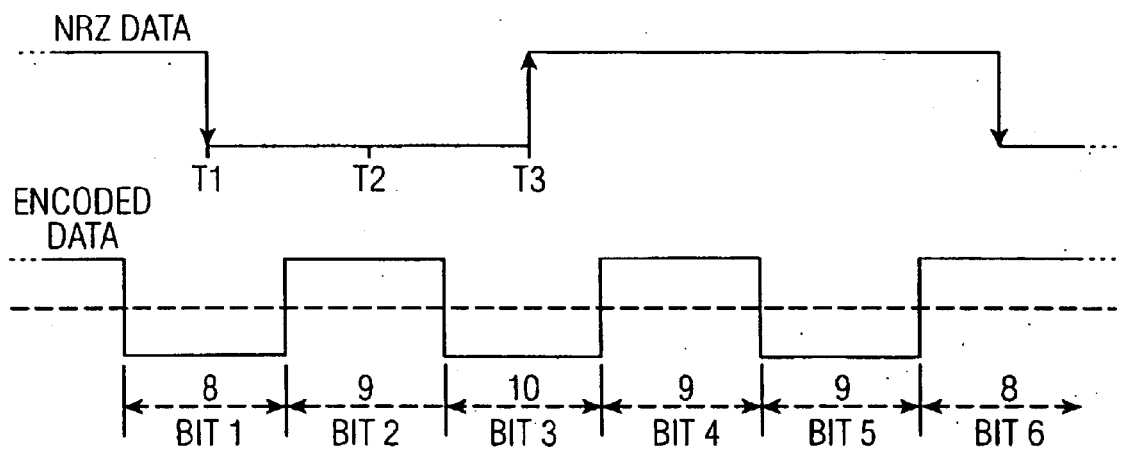

FIG. 6 illustrates an input NRZ waveform (top waveform) being encoded by variable aperture coding (lower waveform). In this example the input NRZ datastream begins with one logic state and switches to another logic state at time T1. The NRZ data maintains this state for the next two bits, then switches logic states at time T3 for the next three bits, after which the NRZ data switches state again. The encoded data is phase shifted by 90 degrees to convert the encoded data from phase to voltage.

The NRZ data per se is not used to switch the biphase modulator. The NRZ data can have a bitstream of 1 or 0 logic states. This bitstream is encoded into a bitstream that has 0 degree and 180 degree transitions with varying time duration. This variability in time duration for which a particular bit remains high or low, encodes a 1 to 0 transition, a 0 to 1 transition, or no change in the original NRZ levels. It is this time varying waveform that modulates the biphase modulator. A 90 degree phase shift in the output waveform of the modulator results from passing the biphase modulated signal through a linear phase bandpass filter, which introduces a phase shift. Bandpass filtering a square wave signal produces a sinusoidal signal.

When data coding begins, if the NRZ data does not switch phase from a previous bit, the duration of the coded bit is 9 clock periods. When the NRZ data switches phase from logic 1 to logic 0 at time T1 the corresponding encoded bit (1) comprises 8 clock periods. The next coded bit (2) comprises 9 clock periods since the NRZ data did not change phase. The following coded bit (3) comprises 10 clock periods because the corresponding NRZ bit changed phase from logic 0 to logic 1 at time T3. This coding pattern continues for the duration of the NRZ data stream.

A receiver of the VAC encoded signal includes an input linear phase delay bandpass filter to remove out of band signal components. This bandpass filter is followed by a differentiator that reverses the 90 degree phase shift imparted to the signal by the low pass integrator filter at the transmitter. This reverse action restores the information in the received waveform to bit polarity change points from voltage peak points. The differentiator is followed by a limiting amplifier and a quadrature phase detector that acts as a zero crossing detector for the three sinusiodal frequency signals produced at the transmitter. These three signals correspond to the three carriers produce by the VAC encoding process which increases bit width, decreases bit width, or leaves the bit width unchanged as discussed previously. Since the zero crossing points occur at different frequencies, the output of the detector will be an NRZ signal with varying bit widths corresponding to the transmitted encoded signal. This signal is applied to a decoder to re-establish the proper bit sequences to replicate the original transmitted NRZ data.

FIG. 2 depicts a variable aperture coder in accordance with the principles of the invention. An input NRZ bitstream to be VAC encoded is applied to a "D" input of a flip-flop 210, eg., a commercial type 7474 flip-flop, cascaded with a second flip-flop 212. Outputs of these flip-flops are connected to a logic network arranged as shown, including exclusive-OR logic gates 216 and 226 (type 7486), inverter 218, AND gates 220 and 222, OR gate 224, logic high speed counter 230, J-K flip-flop 236, and a divide-by-nine frequency divider 240 which provides a clock output to clock inputs of associated circuits 210, 212 etc.

Variable Aperture Coding results from the fact that, depending on the original NRZ waveform exhibiting a 1 to 0 logic transition or a 0 to 1 logic transition, the output encoded waveform intersects the "zero crossing" point earlier or later. There is only one transition per bit, and a receiver uses this information is used to recover the original NRZ information. The encoded data is further passed through a band pass filter (block 720 in FIG. 7) that imparts a 90 degree phase shift to the encoded datastream. This phase shift transforms the bit-polarity change to voltage peak points. The low pass filter, or integrator, can be replace by a suitable bandpass filter. A bandpass filter is required to remove out of band fourier components and to provide only the sideband signal component. The output of this bandpass filter is a sinusiodal signal with a variable period. This sideband bandpass filter exhibits a linear phase delay characteristic (eg., a Bessel characteristic). The filtered single sideband signal from this filter is the J1 Bessel of the encoded signal, and can be either phase modulated or frequency modulated on a radio frequency (RF) carrier for transmission over a transmission channel.

When there is a bit polarity change on the encoded waveform, it transfers the polarity change to a 0 degree or a 180 degree phase reversal on to the carrier Fc, shown in block 710. This biphase shifted signal is combined at the output of the biphase modulator to have a constant envelope signal that has periodic phase reversals. This signal is then applied to bandpass filter 720, which imparts a 90 degree phase shift to the input waveform. In this regard it is noted that if a square wave (one high and one low bit) is passed through a bandpass filter the point of maximum or minimum amplitude will correspond the the center of the bit period Flip-flops 210 and 212 together with ex-OR gate 216 determine whether there has been a 0 to 1 or a 1 to 0 logic level transition in the input datastream. Gates 220, 222 224, inverter 216 and ex-OR gate 226, together with flip-flops 210 and 212 set the frequency divider ratios (8, 4, 2, 1) of high speed counter 230 that is clocked at a clock frequency that is ten times the clock speed used to do bit-by-bit comparison at flip-flops 210 and 212. A VAC encoded datastream (FIGS. 5, 6) appears at the output of unit 236.

FIG. 3 shows the encoder logic employed by the network of FIG. 2 to produce the various frequency divider factors employed by the FIG. 2 network to control high speed counter 230 which performs the bit width variations shown in FIGS. 5 and 6. The output of counter 230 is passed through J-K flip-flop 236 so that the output of flip-flop 236 represents the bit transitions of the original NRZ bitstream waveform at the middle of a bit period of the encoded waveform as shown in FIGS. 5 and 6.

FIG. 6 illustrates an input NRZ datastream to be VAC encoded as applied to input flip-flop 210, and a corresponding output encoded data waveform as produced at the output of flip-flop 236 in FIG. 2. In FIG. 6, the encoded data waveform exhibits a nominal bit width of nine clock cycles. This nominal bit width remains unchanged when the logic level of the input NRZ waveform does not change. When the input NRZ waveform changes from a 1 to a 0 logic level at time T1, the width of the associated bit (bit 1) in the output encoded datastream is reduced by one clock cycle to produce a bit width 8 clock cycles wide, as shown in the VAC encoded data waveform of FIG. 5. That is, the bit width is reduced by ⅑ of the nominal bit period. When the input NRZ waveform remains unchanged, eg., for the period including time T2, the width of the associated bit (bit 2) remains unchanged from the nominal bit width encompassing nine clock cycles. When the input NRZ waveform changes from a 0 to a 1 logic level at time T3, the bit width of the associated bit (bit 3) in the output encoded datastream is increased by one clock cycle to produce a bit width 10 clock cycles wide. That is, the bit width is increased by 10/9 of the nominal bit period.

FIG. 4 illustrates a decoder 400 at a receiver. The received variable bit width bitstream from a zero crossing detector is synchronized with the receiver's clock by a D-type flip-flop 410. Edge detection is accomplished by a network including flip-flop 410 and exclusive-OR logic gate 412, which tracks data (edge) transitions. The output signal from gate 412 is used to reset a 7-bit counter 416 which is clocked at 72 times the NRZ data rate. The output of counter 416 is applied to a detector 420 that indicates when unit 416 has reached a count of 80. This condition represents a unique count in that it represents the reception of a logic 0 level followed by a logic 1. This signal from detector 420 resets 7-bit counter 422. The output of ex-OR gate 412 represents detected edges, and is used to load counter 422. After counter 422 is reset, it counts to 32 (4×8 clocks) and resets again. This operation resynchronizes the counter with the beginning of the next data bit. A new constant is loaded into counter 422 from unit 432 on every detected edge. If the detected edge occurs at a count of 32 (as determined by detector 428) after a reset, a value of 88 (128−40) is loaded into counter 422 from unit 432. If an edge is detected after 40 counts (as determined by detector 430) after a reset, a constant value of 96 is loaded into counter 422 from unit 432. The loaded constant values 88 or 96 are chosen so that zeroing of counter 422 appears at the start of the next encoded data bit. An R-S flip-flop 440 is set (S) or reset (R) depending on whether a 32 count or a 40 count is detected by units 422, 428 and 430. The output of flip-flop 440 is the NRZ output of decoder 400. The purpose of the constant is to enable a single counter with programmable counter settings to decode the different widths of the decoded pulse train. Without this architecture, separate counters will have to be used to make the decision.

A spread spectrum implementation of the present invention is discussed below. FIGS. 7 and 8 respectively show spread spectrum transmitter and receiver arrangements suitable for use in accordance with the present invention. In the transmitter of FIG. 7, VAC encoded data from encoder 200 of FIG. 2 is applied to one input of a balance modulator 710, the other input of which receives a carrier at a frequency fc. The modulated signal from unit 710 is low pass filtered by filter 720 to extract the encoded VAC information and component fc+fb. The filter output signal is applied to one input of a mixer 722, the other input of which receives a signal fRF+PN from a mixer 724. The PN signal, a pseudorandom noise signal in accordance with spread spectrum practice, is provided by a PN generator and differential encoder 728 as known. PN generators and differential encoders are fundamental to the generation of spread spectrum systems. The output signal from mixer 722 is constituted by RF component fRF and the pseudorandom noise component PN in accordance with spread spectrum practice, and the VAC encoded information. This signal to be transmitted at a frequency ftx is applied to a transmitting antenna 734 via transmission interface and output networks (not shown to simplify the drawing). A local clock generator 740 provides a spread clock to unit 728 and a data clock to encoder 200.

In the case of a 900 Mhz system for transmission in the 902 Mhz–928 Mhz band for example, the following signal characteristics apply:

fTX: fRF+PN+fc+fb for fTX=905 Mhz, fRF=894.25 Mhz

NRZ data: 1.5 Mbps fc: 10 Mhz fb: 710 Khz, 750 Khz, 794 Khz f=f: 84 Khz

In the spread spectrum receiver 800 of FIG. 8, a received signal from an antenna 802 is bandpass filtered by filter 804 to reject out-of-band signal components. The filtered signal is amplified by a low noise amplifier (not shown to simplify the drawing) before being split into two paths by a power splitter (not shown). The split signals are applied to inputs of mixers 806 and 808. The mixers are respectively provided with mutually quadrature phased input signals from a network including a local oscillator 812 and a phase shifter 810. The frequency of the local oscillator signal fRF is used to down convert the received signal to baseband.

Baseband quadrature output signals from mixers 806 and 808 are respectively high pass filtered by units 816 and 818 to remove frequency components from DC to about 30 Khz before passing these signals through variable gain amplifiers 820, 822 having 75 db of gain and about 65 db of gain control range. The variable gain amplifiers provide gain to the baseband signal, which when received is weak and is converted to baseband by mixing with the local oscillator, and is then amplified to about 1 volt, for example. Gain control is needed to prevent the incoming signal from being distorted. The control signal is derived from a microcontroller (not shown to simplify the drawing). Switched filter capacitors in block 820 can adjust the low pass cut-off frequency depending on the chipping rate of the PN code. Within the pass band of the band pass filter there will be the basic PN code, Doppler frequency due to the non-synchronous nature of transmit and receive local oscillators, and the frequency shift keying (FSK) signal due to the variable aperture signal on the transmitter voltage controlled oscillator (VCO). This FSK signal is filtered for all the PN signals and applied to a two-pole bandpass filter 830. The output of high pass filter 830 is applied to an FM receiver/demodulator network 832 of a conventional type, where the input signal is up converted to 10.7 MHz, bandpass filtered, limited and quadrature detected. The quadrature detector in network 832 converts the voltage peak points of the received signal to bit polarity changes by performing zero crossing detection. The output of the detector in network 832 will exhibit different pulse widths because the zero crossing points of the three frequencies from the transmitter occur at different points on the discriminator "S" curve of the quadrature coil associated with the detector. This detector output is provided to variable aperture decoder 836, e.g., as shown in FIG. 4, which restores the original NRZ data waveform.

Output signals from variable gain amplifiers 820 and 822 are amplitude limited before being applied to filters 824 and 826 and a spread spectrum demodulator network 840. The spread spectrum demodulator may be of conventional type, and in this example includes a one-bit analog to digital converter 842, one bit delay 844 and multiplier 846 in the in-phase "I" signal path, a one-bit analog to digital converter 852, one bit delay 854 and multiplier 856 in the in-phase "Q" signal path, a combiner 860, correlator 864, and low pass filter 866. Multiplier 846 produces an output "dot product" (Q·I) of the Q path signal and the delayed I path signal from delay 844. Multiplier 856 similarly produces an output dot product signal (I·Q). These dot products of the I and Q signals assist carrier de-rotation to remove the Doppler frequency shift from the I and Q signals. The correlator responds to a locally generated PN reference that can be advanced or retarded with respect to the incoming PN code. The received spread code is compared in correlator 864 with a reference PN code. The local PN code is advanced or retarded to get maximum correlation with the incoming PN code using known circuits. Filters 824, 826 in both the I and Q channels are baseband filters for filtering the baseband signal. Output pulses from correlator 864 are low pass filtered by unit 866 to produce a signal suitable for an automatic frequency control (AFC) of local spread clock oscillator 812. Unit 864 correlates the phase of the incoming PN sequence so that the transmitter and the receiver are synchronized. The spread clock and data clocks are all derived from the same reference so that once the spread clock is acquired the data clock is also acquired. Transmitter and receiver synchronization is achieved in this manner. A local clock generator 870 provides a Spread Clock to correlator 864, and a Data Clock to decoder 836. The spread clock is the phase of the clock with with received PN sequence and the local PN sequence fully synchronized. To achieve synchronism, the phase of the local PN clock has to be either advanced or retarded until the signals are maximally correlated.

Network 840 is a very effective demodulator for FSK, MSK, PSK and QPSK modulations. Almost all these modulation schemes are used in current spread spectrum implementations available commercially.

Transmitter and receiver spread spectrum signal processing architectures using a compressed datastream with any type of spread spectrum other than that disclosed may be used in conjunction with variable aperture coding/decoding in accordance with the principles of the present invention. Zero intermediate frequency (IF) or single/double conversion schemes may be used at a receiver, and either direct drive or mix and drive schemes may be used at transmitters, for example. Although an example of a 900 Mhz carrier frequency operating system has been given, implementations with carrier frequencies above 50 Khz may also be used.

We claim:

1. In a system for processing a digital input signal, a method for producing a coded output signal as a function of a change in a single variable parameter including a logic state of said input signal, comprising the steps of:
    generating a first pulse width coded bit with a predetermined duration of a multiple of a basic clock period when said input signal represents no change of said parameter;
    generating a second pulse width coded bit when said input signal represents a first type of change in said parameter; and
    generating a third pulse width coded bit when said input signal represents a second type of change in said parameter, wherein said first to third pulse width coded bits are different in duration from one another by integral multiples of said basic clock period.

2. A method according to claim 1, wherein
    said parameter is a change in the logic state of said input signal;
    said first type of change is a logic state change in one direction; and
    said second type of change is a logic state change in a second direction.

3. A method according to claim 1, wherein:
    said step of generating said first coded bit produces a coded bit with a predetermined reference bit width;
    said step of generating said second coded bit produces a coded bit with a first predetermined change in bit width relative to said reference bit width; and
    said step of generating said third coded bit produces a coded bit with a second predetermined change in bit width relative to said reference bit width.

4. A method according to claim 1, further comprising the step of processing said coded output signal by a spread spectrum system.

5. A method according to claim 4, wherein said processing step includes the steps of
    modulating said coded output signal on a carrier to produce a modulated signal; and
    mixing said modulated signal with a pseudorandom noise signal to produce a spread spectrum signal; and
    transmitting said spread spectrum signal.

6. A method according to claim 5, further including the step of low pass filtering said modulated signal prior to said mixing step.

7. In a system for processing a digital input signal a method for producing a coded output signal as a function of a change in a parameter including a logic state of said input signal, comprising the steps of:
    generating a first pulse width coded bit with a predetermined duration and a predetermined reference bit width when said input signal represents no change of said parameter;
    generating a second pulse width coded bit when said input signal represents a first type of change in said parameter,
    said step of generating said second coded bit produces a coded bit with a first predetermined change in bit width comprising a predetermined increase in bit width relative to said reference bit width, when said input signal exhibits a logic state change in one direction; and
    generating a third pulse width coded bit when said input signal represents a second type of change in said parameter, wherein said first to third pulse width coded bits are different from one another; and
    said step of generating said third coded bit produces a third coded bit with a second predetermined change in bit width comprising a predetermined decrease in bit width relative to said reference bit width, when said input signal exhibits a logic state change in another direction.

8. In a system for processing a digital input signal, a method for producing a coded output signal as a function of a change in a parameter including a logic state of said input signal, comprising the steps of:
    generating a first pulse width coded bit with a predetermined duration and a predetermined reference bit width when said input signal represents no change of said parameter; said step of generating said first coded bit produces a coded bit encompassing a predetermined number of clock periods when said input signal does not exhibit a logic state change;
    generating a second pulse width coded bit when said input signal represents a first type of change in said parameter,
    said step of generating said second coded bit produces a coded bit encompassing a first predetermined change in bit width comprising a predetermined increase in clock periods when said input signal exhibits a logic state change in one direction; and
    generating a third pulse width coded bit when said input signal represents a second type of change in said parameter, wherein said first to third pulse width coded bits are different from one another; and
    said step of generating said third coded bit produces a coded bit with a second predetermined change in bit width relative to said reference bit width encompassing a predetermined decrease in clock periods when said input signal exhibits a logic state change in another direction.

9. A method according to claim 8, wherein
    said first coded bit encompasses N predetermined clock periods;
    said second coded bit encompasses N+1 clock periods; and
    said third coded bit encompasses N−1 clock periods; wherein N is greater than 1.

10. A method according to claim 9, wherein
    N is less than 15.

11. A decoding method for producing a decoded datastream from a received bitstream comprising first, second and third pulse width coded bits representing changes in a single variable parameter of an input datastream, said decoding method comprising the steps of generating a first data component representing no change of said parameter, in response to said first coded bit of predetermined duration equal to a multiple of a basic clock period;

generating a second data component representing a first type of change in said parameter, in response to said second coded bit; and generating a third data component representing a second type of change in said parameter, in response to said third coded bit, wherein said first to third pulse width coded bits are different in duration from one another by integral multiples of said basic clock period.

12. A decoding method according to claim 11, wherein said parameter is a logic state of said input datastream;

said first data component represents no change in said logic state;

said second data component represents a change in said logic state in one direction; and said third data component represents a change in said logic state in another direction.

13. A decoding method for producing a decoded datastream from a received bitstream comprising first, second and third pulse width coded bits representing chances in a single variable parameter of an input datastream said decoding method comprising the steps of generating a first data component representing no change of said parameter, in response to said first coded bit of predetermined duration equal to a multiple of a basic clock period;

generating a second data component representing a first type of chance in said parameter, in response to said second coded bit; and generating a third data component representing a second type of change in said parameter, in response to said third coded bit, wherein said first to third pulse width coded bits are different in duration from one another; wherein said first coded bit encompasses N predetermined clock periods;

said second coded bit encompasses N+1 clock periods; and said third coded bit encompasses N−1 clock periods.

14. A decoding method according to claim 13, further comprising the steps of mixing said received bitstream with a reference signal to produce a frequency downconverted bitstream;

frequency demodulating said downconverted bitstream to produce a demodulated signal; and decoding said demodulated signal in accordance with said generating steps to produce said first, second and third data components.

15. A decoding method according to claim 14, wherein said mixing step includes the step of phase shifting said received bitstream to produce mutually quadrature phase signals;

processing said quadrature signals by means of a spread spectrum demodulator to produce a control signal; and applying said control signal to said mixing step.

* * * * *